US008884830B2

(12) United States Patent
Chang et al.

(10) Patent No.: US 8,884,830 B2
(45) Date of Patent: Nov. 11, 2014

(54) HIGH-FREQUENCY CHIP ANTENNA MEASUREMENT SYSTEM

(71) Applicant: National Chung Cheng University, Chia-Yi (TW)

(72) Inventors: Chia-Chan Chang, Min-Hsiung Township, Chiayi County (TW); Sheng-Fuh Chang, Min-Hsiung Township, Chiayi County (TW); Chun-Chi Lin, New Taipei (TW); Sheng-Chi Hsieh, Kaohsiung (TW)

(73) Assignee: National Chung Cheng University, Min-Hsiung, Chia-Yi (TW)

( * ) Notice: Subject to any disclaimer, the term of this patent is extended or adjusted under 35 U.S.C. 154(b) by 167 days.

(21) Appl. No.: 13/757,279

(22) Filed: Feb. 1, 2013

(65) Prior Publication Data

US 2014/0139382 A1 May 22, 2014

(30) Foreign Application Priority Data

Nov. 22, 2012 (TW) .................................. 101143743

(51) Int. Cl.
*G01R 29/10* (2006.01)
(52) U.S. Cl.
CPC ...................................... *G01R 29/10* (2013.01)
USPC ........................................................ 343/703
(58) Field of Classification Search
CPC ....................................................... G01R 29/10
USPC ........................................................ 343/703
See application file for complete search history.

(56) References Cited

U.S. PATENT DOCUMENTS

| 8,400,366 | B2 * | 3/2013 | Kitada .......................... 343/703 |
| 8,576,129 | B2 * | 11/2013 | Partee et al. .................. 343/703 |
| 2005/0128150 | A1 * | 6/2005 | Chen ............................. 343/702 |
| 2007/0279212 | A1 * | 12/2007 | Hong et al. ................... 340/514 |

* cited by examiner

*Primary Examiner* — Dameon E Levi
*Assistant Examiner* — Hasan Islam
(74) *Attorney, Agent, or Firm* — Muncy, Geissler, Olds & Lowe, P.C.

(57) ABSTRACT

A high-frequency chip antenna measurement system includes a platform; two piers; an arching; a stepper motor; an indication and fastening assembly having a source antenna holder and an illuminant indicator; a carrier stage; a chip antenna carrier having a support member and two sloping posts extending upward and outward from a top end of the support member, two chip antenna carrier benches being mounted to top ends of the two sloping posts respectively; a probe carrier having a support plate directionally variably fixed to the carrier substrate, two props fixed to the support member and parallel to each other and extending outward and upward slantingways, and a probe carrier bench mounted to top ends of the two props for bearing a probe; and a bridging member having two ends mounted to the chip antenna carrier benches.

9 Claims, 7 Drawing Sheets

HIGH-FREQUENCY CHIP ANTENNA MEASUREMENT SYSTEM

BACKGROUND OF THE INVENTION

1. Field of the Invention

The present invention relates generally to chip antenna measurement and more particularly, to a high-frequency chip antenna measurement system.

2. Description of the Related Art

The conventional chip antenna measurement platforms based on antenna far-field pattern measurement methods are constructed as shown in FIGS. 9-10, respectively.

In the chip measurement platform 100 shown in FIG. 9, a source antenna 101 is fixed to a fastening pillar 103 located at one end of a chassis 102, a chip antenna 104 is mounted onto a carrier bench 105, and the carrier bench 105 is connected with a carrier pillar 106 located at the other end of the chassis 102. When it is intended for measurement, the source antenna 101 and a probe 107 are connected to a measuring instrument 109 via a high-frequency coaxial cable 108. The source antenna 101 can provide or receive electromagnetic energy for or from the chip antenna 104. The carrier pillar 106 can be turned manually or by a motor for angle switchover for measurement at different angles. However, such platform can only measure the radiation pattern on the x-y plane not on the y-z plane and the x-z plane.

In the antenna measurement platform 110 shown in FIG. 10, a source antenna 111 is fixed onto a semicircular arching 112 and a chip antenna 113 and a probe 114 are mounted onto a disk-shaped chassis 115. When it is intended for measurement, the source antenna 111 and the probe 114 are connected to a measuring instrument 119 via a high-frequency coaxial cable 118. The source antenna 111 can provide or receive electromagnetic energy for or from the chip antenna 113. The semicircular arching 112 can be turned manually or by a motor for angle switchover for measurement at different angles. Taking the structure indicated in FIG. 10 as an example, after the pattern measurement on the x-z plane is finished, the semicircular arching 112 or the chip antenna 113 and the probe 114 can be turned on z-axis for 90 degrees for pattern measurement on y-z plane. However, such platform can only measure the radiation pattern on the x-z and y-z planes not on x-y plane. Even so, only upper-half patterns relative to the disk-shaped chassis 115 can be obtained on those x-z and y-z planes.

SUMMARY OF THE INVENTION

The primary objective of the present invention is to provide a high-frequency chip antenna measurement system, which can measure radiation patterns on x-z, y-z, and x-y planes to improve the insufficiency of the conventional measurement platforms.

The foregoing objective of the present invention is attained by the high-frequency chip antenna measurement system composed of a platform, two piers, an arching, a stepper motor, an indication and fastening assembly, a carrier stage, a chip antenna carrier, a probe carrier, and a bridging member. The two piers are mounted onto the platform. The arching includes two ends pivotably mounted to the two piers, respectively. A midpoint of the arching is higher than two ends of the arching when the arching is located at the origin. The stepper motor is mounted to one of the priers to be connected with the arching for driving the arching to pivot. The indication and fastening assembly includes a source antenna holder and an illuminant indicator. The illuminant indicator is movably mounted to the arching. The source antenna holder is mounted below the illuminant indicator for installing a source antenna. The carrier stage is mounted to the platform and located between the two piers and includes a carrier substrate at a top end thereof. The chip antenna carrier includes a support member and two sloping posts extending upward and outward from a top end of the support member. Two chip antenna carrier benches are mounted to top ends of the two sloping posts, respectively. The support member has a bottom side fixed to the carrier substrate. The probe carrier includes a support plate, two props, and a probe carrier bench. The support plate is directionally variably fixed to the carrier substrate. The two props are fixed to the support member and parallel to each other, extending outward and upward slantingways. The probe carrier bench is mounted to top ends of the two props for bearing a probe. The bridging member has two ends mounted to the chip antenna carrier benches, respectively. A chip antenna is mounted to a center of the bridging member.

Preferably, the two piers are columnar.

Preferably, the arching includes two ends, one of which is pivotably mounted to a top end of one of the piers via a pivotal member and the other is connected with the stepper motor in such away that the arching can be driven by the stepper motor for pivoting movement.

Preferably, the interval and the depth of space between the two chip antenna carrier benches are greater than the width of half-power beam of the source antenna each.

Preferably, the two sloping posts of the chip antenna carrier can be jointly V-shaped or U-shaped or shaped like an inverted symbol "Ω". The width between two points of a top side of and the depth of an opening of the V-shaped, U-shaped, or Ω-shaped profile are greater than the width of half-power beam of the source antenna each.

Preferably, the support plate of the probe carrier is disk-shaped and surrounds a bottom side of the support member of the chip antenna carrier. The support plate includes a plurality of through holes and can be detachably fixed to the carrier substrate via a plurality of bolts. After the support plate is detached from the carrier substrate, changing where the through holes correspond to the carrier substrate can change the angle of the probe carrier with respect to the carrier stage.

Preferably, the interval between the two props is larger than the width of half-power beam of the source antenna and smaller than the width of the probe carrier bench.

Preferably, the probe carrier bench includes an elongated hole at a center thereof and two more elongated holes beside the aforesaid one.

Preferably, the illuminant indicator is slidably sleeved onto the arching.

DETAILED DESCRIPTION OF PREFERRED EMBODIMENTS

Figure 1:
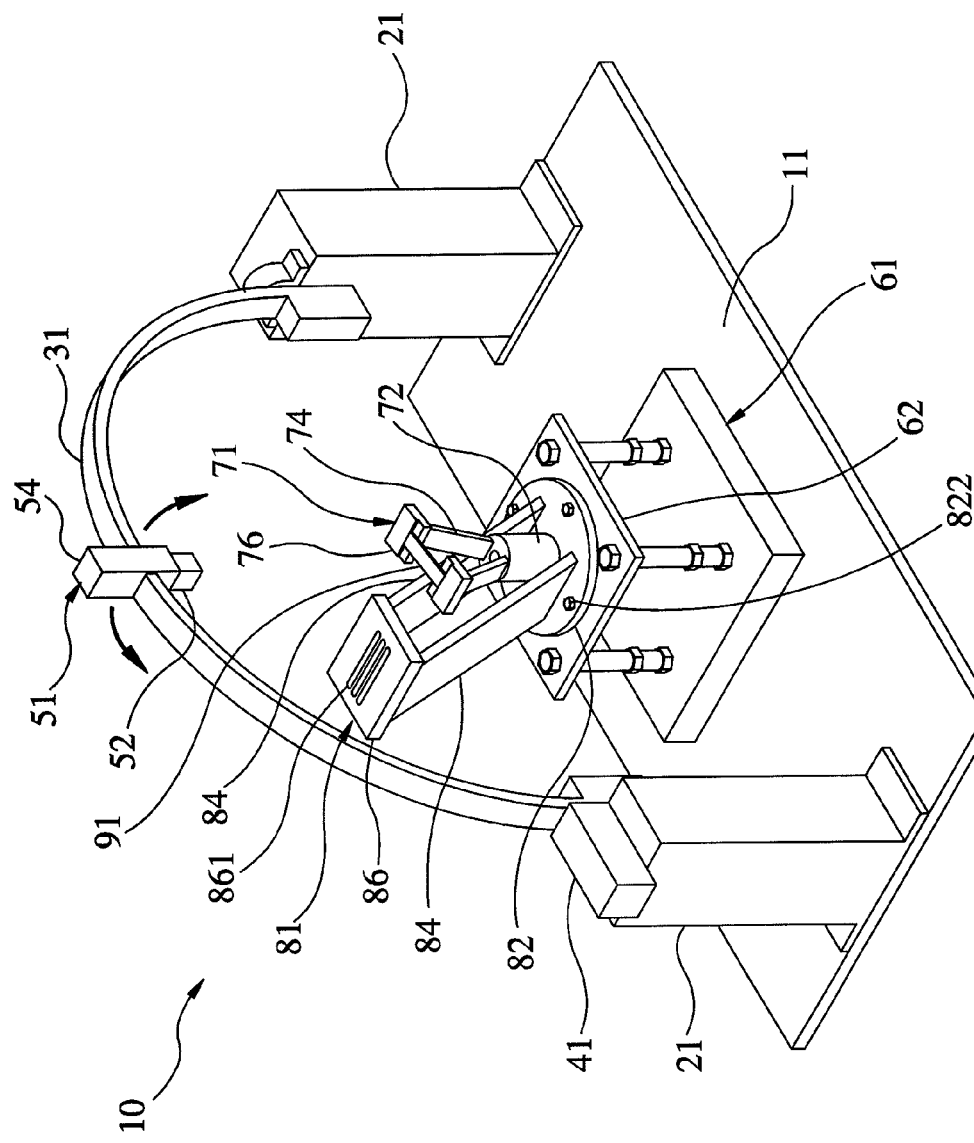
FIG. 1 is a perspective view of a preferred embodiment of the present invention.
Figure 2:
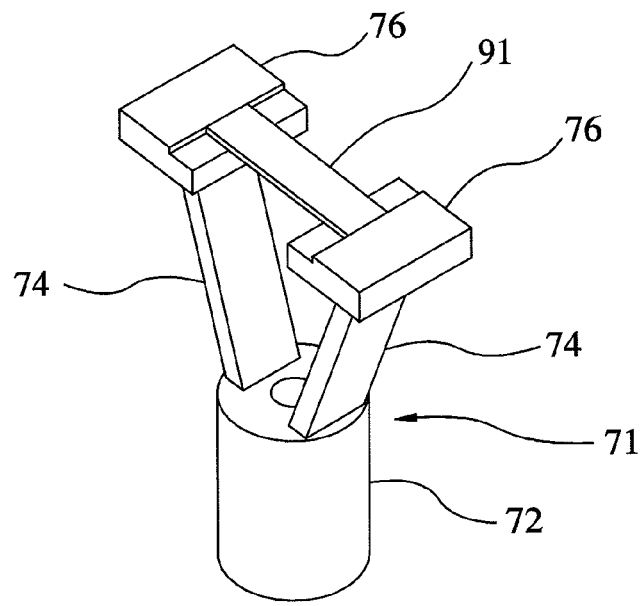
FIG. 2 is a perspective view of the chip antenna carrier of the preferred embodiment of the present invention.
Figure 3:
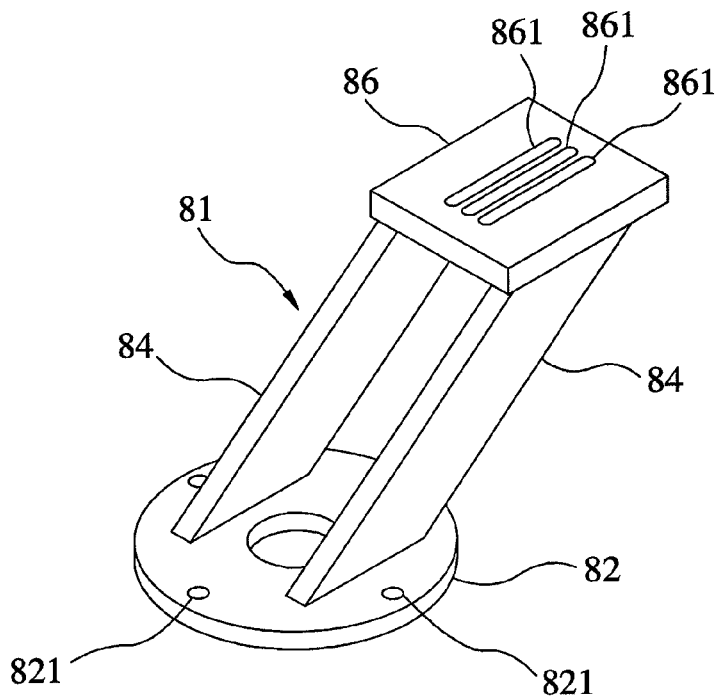
FIG. 3 is a perspective view of the probe carrier of the preferred embodiment of the present invention.
Figure 4:
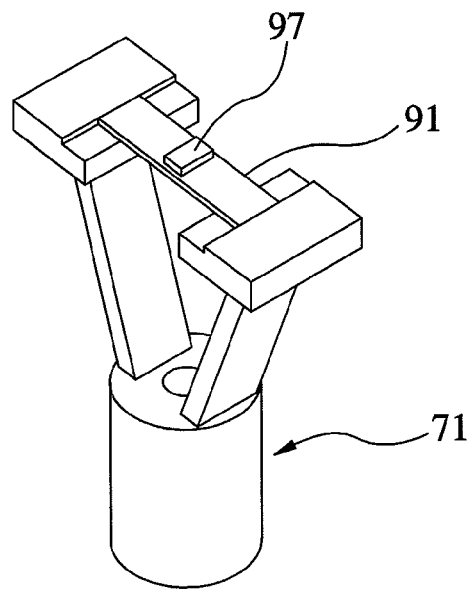
FIG. 4 is a perspective view of the preferred embodiment of the present invention, illustrating that the chip antenna is placed for x-axis feeding.
Figure 5:
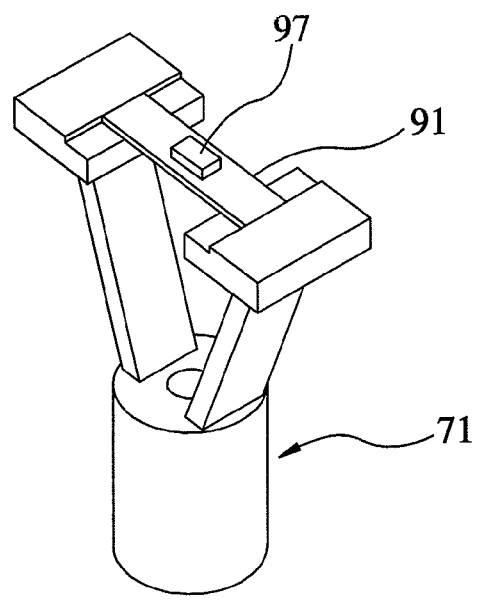
FIG. 5 is a similar to FIG. 4, illustrating that the chip antenna is placed for y-axis feeding.

Structural features and desired effects the present invention will become more fully understood by reference to a preferred embodiment given hereunder. However, it is to be understood that the embodiment is given by way of illustration only, thus are not limitative of the claim scope of the present invention.

Referring to FIGS. 1-6, a high-frequency chip antenna measurement system 10 in accordance with a preferred embodiment of the present invention is composed of a platform 11, two piers 21, an arching 31, a stepper motor 41, an indication and fastening assembly 51, a carrier stage 61, a chip antenna carrier 71, a probe carrier 81, and a bridging member 91. The detailed descriptions and operations of these elements as well as their interrelations are recited in the respective paragraphs as follows.

The two piers 21 are mounted onto the platform 11. In this embodiment, the two piers 21 are columnar and can be shaped like something else.

Figure 6:
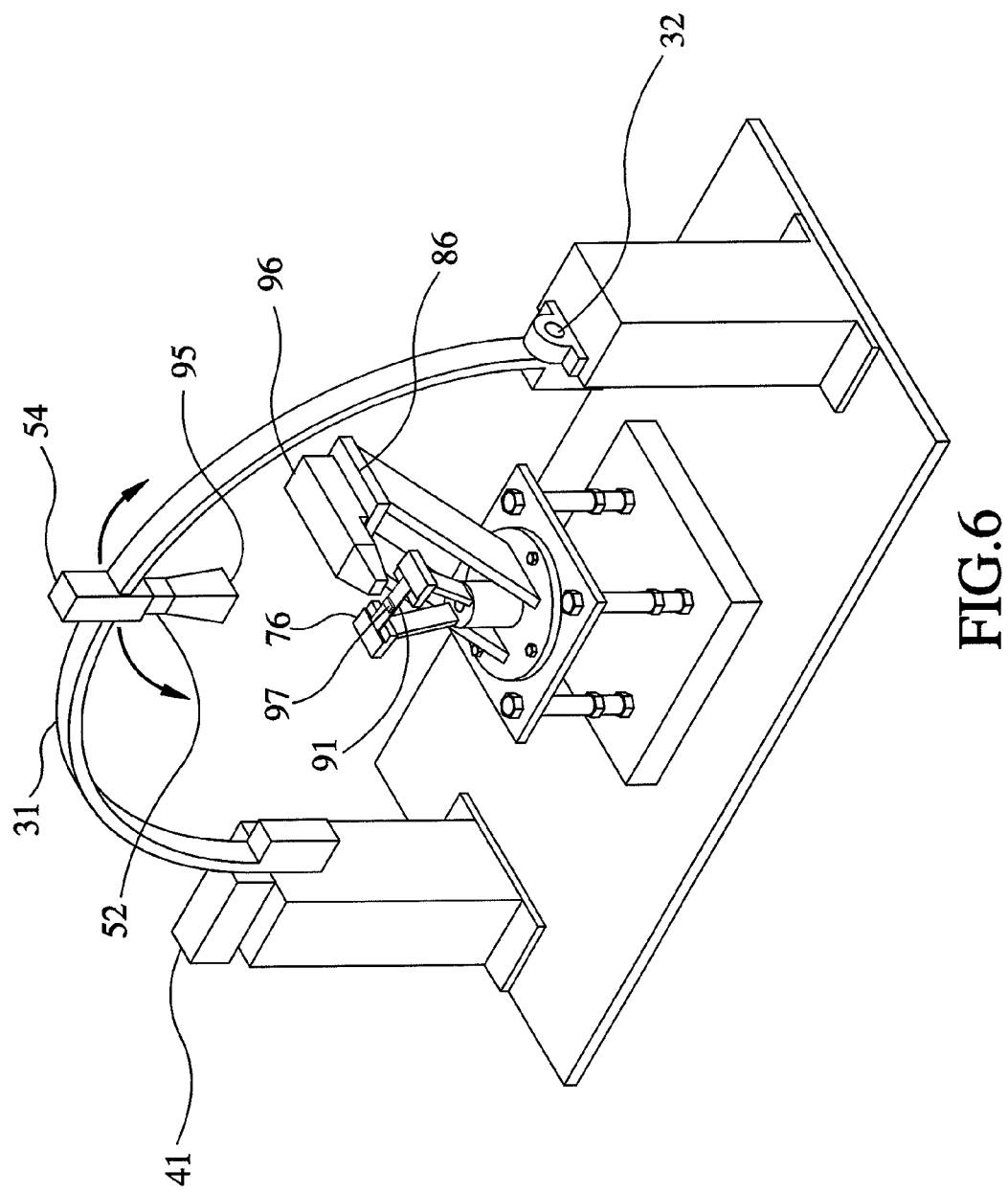
FIG. 6 is a perspective view of the preferred embodiment of the present invention in operation.

The arching 31 includes two ends pivotably mounted to the two piers 21, respectively. When the arching 31 is located at the origin, its midpoint is higher than its two ends. In this embodiment, the arching 31 is semicircular and includes one end pivotably connected with a top end of one of the piers 21 via a pivotal member 32, as shown in FIG. 6.

The stepper motor 41 is mounted to one of the piers 21 and connected with the arching 31 for driving the arching 31 to pivot. In this embodiment, the other end of the arching 21 is connected with a driving shaft (not shown) of the stepper motor 41, so the arching 21 can be driven by the stepper motor 41 to pivot.

The indication and fastening assembly 51 includes a source antenna holder 52 and an illuminant indicator 54. The illuminant indicator 54 is movably mounted to the arching 31 for generating red indicatory light. The source antenna holder 52 is mounted beneath the illuminant indicator 54 for the indicatory light to pass through for installing a source antenna 95. In this embodiment, the illuminant indicator 54 is slidably sleeved onto the arcing 31.

The carrier stage 61 is mounted to the platform 11 and located between the two piers 21, having a carrier substrate 62 at a top end thereof.

The chip antenna carrier 71 includes a support member 72 and two sloping posts 74 extending upward and outward from a top end of the support member 72 respectively. Two chip antenna carrier benches 76 are located at top ends of the sloping posts 74, respectively. The support member 72 includes a bottom side fixed to the carrier substrate 62. In this embodiment, there is space between the two chip antenna carrier benches 76 and the interval and depth of the space are greater than the width of half-power beam of the source antenna 95 each. The two sloping posts 74 of the chip antenna carrier 71 can be jointly V-shaped or U-shaped or shaped like an inverted symbol "Ω". In this embodiment, the two sloping posts 74 are jointly V-shaped as an example and the width between two points of the top side of the V-shaped profile and the depth of opening of the V-shaped profile are greater than the width of the half-power beam of the source antenna 95 each.

The probe carrier 81 includes a support plate 82, two props 84, and a probe carrier bench 86. The support plate 82 is directionally variably fixed to the carrier substrate 62. The two props 84 are fixed to the support plate 82 and parallel to each other, extending outward and upward slantingways. The probe carrier bench 86 is mounted to top ends of the two props 84 for bearing a probe 96. In this embodiment, the support plate 82 is disk-shaped and surrounds a bottom side of the support member 72. The support plate 82 includes a plurality of through holes 821 and is detachably fixed to the barrier substrate 62 via a plurality of bolts 822. After the support plate 82 is detached from the barrier substrate 62, changing where the through holes 821 correspond to the carrier substrate 62 and then fixing the support plate 82 to the barrier substrate 62 again can change the angle of the probe carrier 81 with respect to the carrier stage 61. Besides, in this embodiment, the interval between the two props 84 is larger than the width of half-power beam of the source antenna 95 and smaller than the width of the probe carrier bench 86; the probe carrier bench 86 includes three elongated hole 861, one of which is formed at a center thereof and the other two are formed beside the aforesaid one, for installing a probe 96.

The bridging member 91 includes two ends mounted to the two chip antenna carrier benches 76, respectively. A chip antenna 97 is mounted to a center of the bridging member 91. In this embodiment, the bridging member 91 is made of a material having low dielectric constant.

Referring to FIG. 6, before the present invention starts to measure, it is necessary to adhesively mount the chip antenna 97 to a center of the bridging member 91. In implementation, the chip antenna 97 can be adhesively mounted either to what the illuminant indicator 54 indicates or to the bridging member 91 and then two ends of the bridging member 91 are fixed to the chip antenna carrier benches, respectively. Next, the probe 96 is put on the probe carrier bench 86 and the arching 91 is located at the origin and meanwhile, a midpoint of the arching 31 is the highest point. The source antenna 95 is mounted right beneath the source antenna holder 52.

When it is intended for measurement, the measurement can proceed under the aforesaid circumstances and meanwhile, the chip antenna 97 mounted to the bridging member 91 is placed for x-axis feeding and can measure the radiation pattern on the x-z plane.

Figure 7:
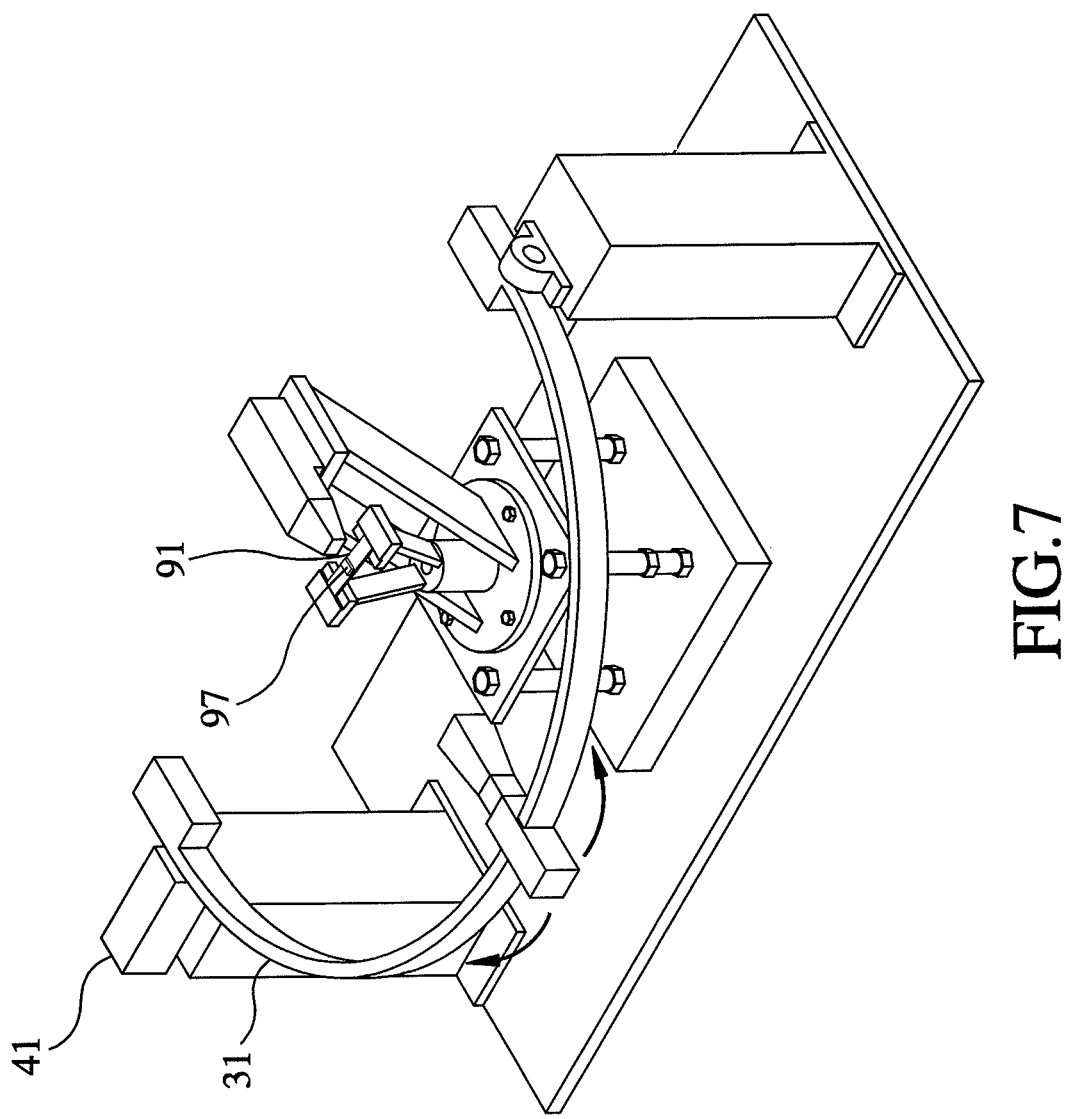
FIG. 7 is another perspective view of the preferred embodiment of the present invention in operation.

When it is intended to change the plane to which the measurement is applied, the stepper motor 41 can be controlled to drive the arching 31 to pivot. When the arching 31 pivots from the upright state shown in FIG. 6 to the horizontal state shown in FIG. 7, the radiation pattern on the x-y plane can be measured.

Figure 8:
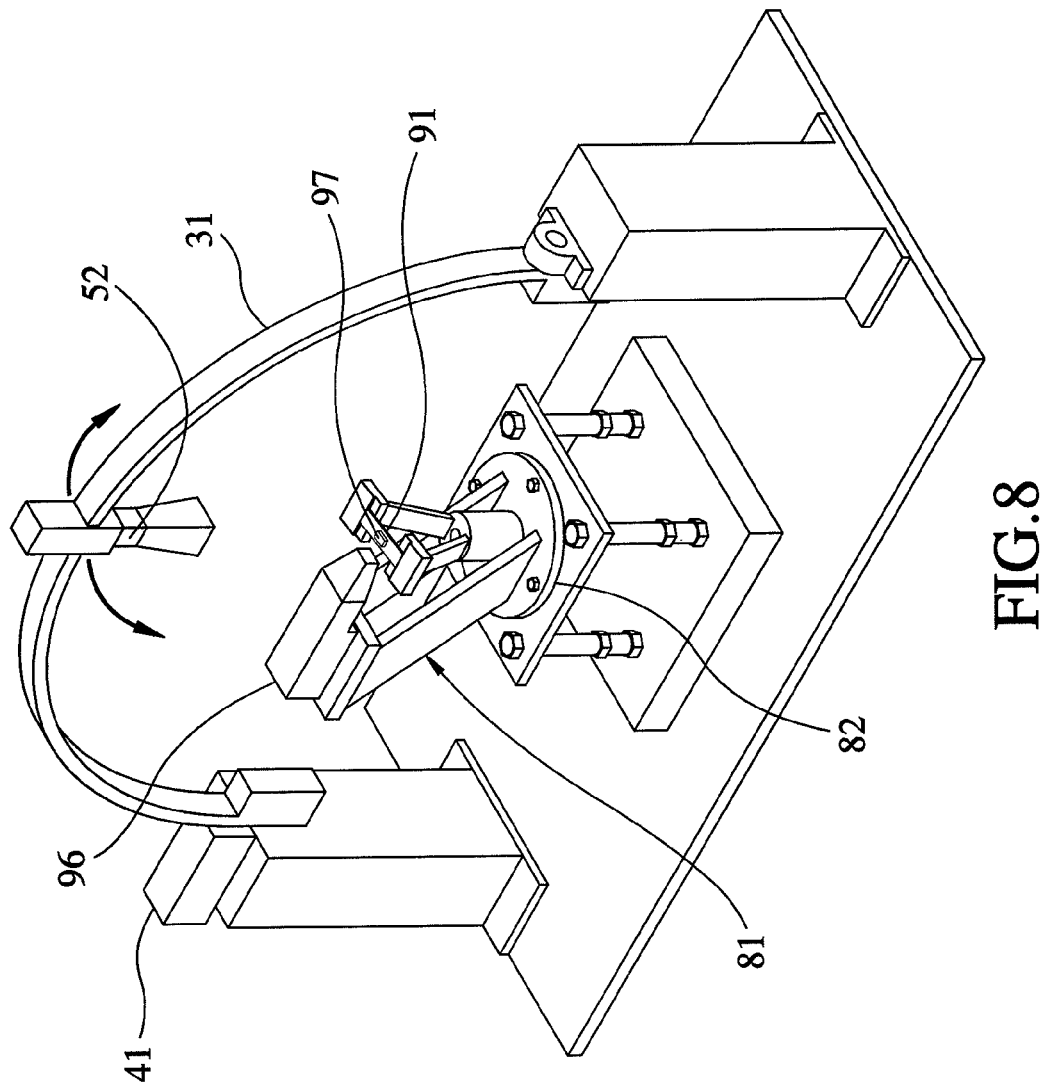
FIG. 8 is another perspective view of the preferred embodiment of the present invention in operation.
Figure 9:
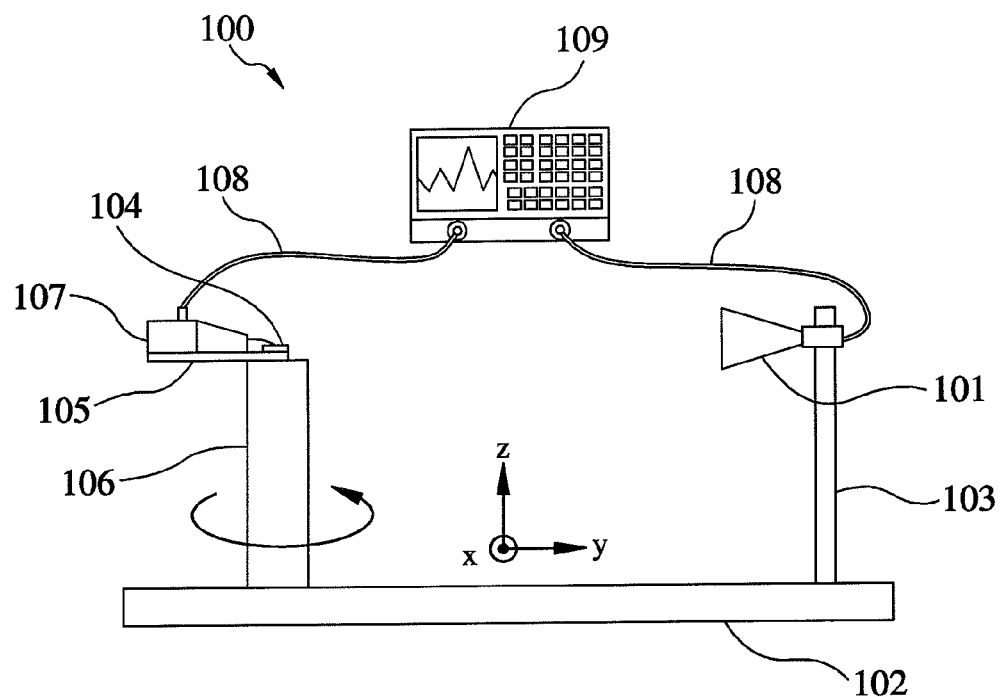
FIG. 9 is a schematic view of a conventional chip antenna measurement platform.
Figure 10:
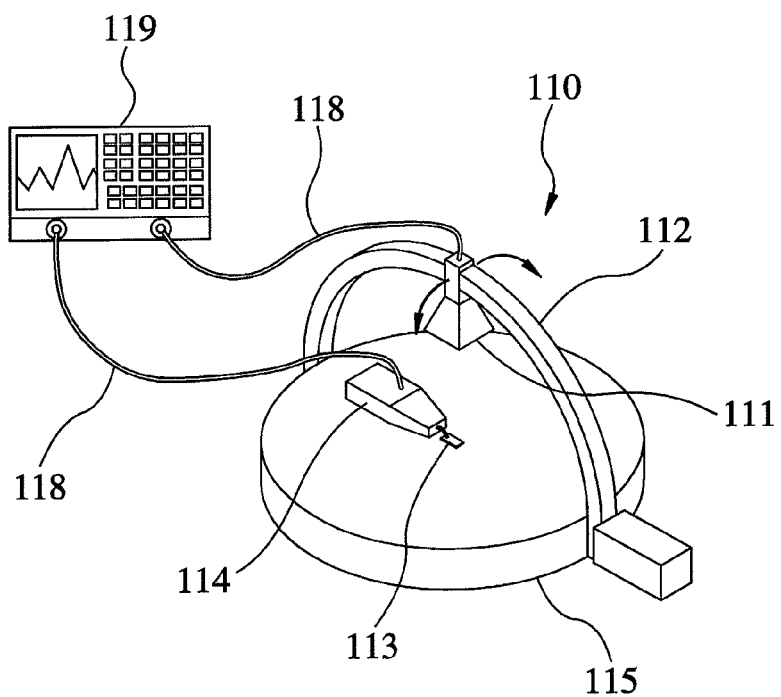
FIG. 10 is a schematic view of another conventional chip antenna measurement platform.

In addition, when it is intended to apply the measurement to the y-z plane, as shown in FIG. 8, the chip antenna 97 on the bridging member 91 can changed to the placement for y-axis feeding and the orientation of the support plate 82 can be changed as shown in FIG. 8, so the orientation of the probe 96 is changed along with the support plate 82. In the meantime, the arching 31 is upright and can measure the radiation pattern on the y-z plane.

The illuminant indicator 54 is slidably sleeved onto the arching 31, so the user can move the illuminant indicator 54 along with the source antenna holder 52 to a random position on the arching 31 and then the stepper motor 41 can drive the arching 31 to pivot to the required position. In this way, three-dimensional radiation pattern can be measured.

In conclusion, the present invention can measure the chip antenna radiation patterns on the x-z, y-z, and x-y planes to improve the inefficiency of the conventional measurement platform.

What is claimed is:

1. A high-frequency chip antenna measurement system comprising:
   a platform;
   two piers mounted onto the platform;
   an arching having two ends pivotably mounted to the two piers respectively, a midpoint of the arching being higher than two ends of the arching while the arching is located at an origin;
   a stepper motor mounted to one of the piers and connected with the arching for driving the arching to pivot;
   an indication and fastening assembly having a source antenna holder and an illuminant indicator, the illuminant indicator being movably mounted to the arching, the source antenna holder being mounted beneath the illuminant indicator for the light generated by the illuminant indicator to pass through, the source antenna holder being adapted for installing a source antenna;
   a carrier stage mounted between the platform and the two piers and having a carrier substrate;
   a chip antenna carrier having a support member and two sloping posts extending upward and outward from a top end of the support member, two chip antenna carrier benches being mounted to top ends of the two sloping posts respectively, the support member having a bottom side fixed to the carrier substrate;
   a probe carrier having a support plate, two props, and a probe carrier bench, the support plate being directionally variably fixed to the carrier substrate, the two props being fixed to the support plate and parallel to each other and extending upward and outward slantingways, the probe carrier bench being mounted to top ends of the two props for bearing a probe; and
   a bridging member having two ends mounted to the chip antenna carrier benches respectively, a chip antenna being mounted to a center of the bridging member.

2. The high-frequency chip antenna measurement system as defined in claim 1, wherein the two piers are columnar.

3. The high-frequency chip antenna measurement system as defined in claim 1, wherein the arching comprises two ends, one of which is pivotably connected with a top end of one of the piers via a pivotal member and the other is connected with the stepper motor whereby the arching can be driven by the stepper motor to pivot.

4. The high-frequency chip antenna measurement system as defined in claim 1, wherein the interval and depth of space between the two chip antenna carrier benches are greater than the width of half-power beam of the source antenna each.

5. The high-frequency chip antenna measurement system as defined in claim 1, wherein the two sloping posts are jointly V-shaped or U-shaped or shaped like an inverted symbol "$\Omega$", the width between two points of a top side of and the depth of an opening of the V-shaped, U-shaped, or $\Omega$-shaped profile being greater than the width of half-power beam of the source antenna each.

6. The high-frequency chip antenna measurement system as defined in claim 1, wherein the support plate of the probe carrier is disk-shaped and surrounds a bottom side of the support member of the chip antenna carrier, the support plate having a plurality of through holes and being detachably fixed to the carrier substrate via a plurality of bolts; after the support plate is detached from the carrier substrate, changing where the through holes correspond to the carrier substrate can change the angle of the probe carrier with respect to the carrier stage.

7. The high-frequency chip antenna measurement system as defined in claim 1, wherein the interval between the two props is larger than the width of half-power beam of the source antenna and smaller than the width of the probe carrier bench.

8. The high-frequency chip antenna measurement system as defined in claim 1, wherein the probe carrier bench comprises three elongated holes, one of which is formed at a center thereof and the other two are formed beside the aforesaid one.

9. The high-frequency chip antenna measurement system as defined in claim 1, wherein the illuminant indicator is slidably sleeved onto the arching.

* * * * *